United States Patent
Lee et al.

(10) Patent No.: US 9,787,430 B2
(45) Date of Patent: Oct. 10, 2017

(54) DYNAMIC SETTING OF FEC IN EMBMS VIDEO STREAMING

(71) Applicant: QUALCOMM Incorporated, San Diego, CA (US)

(72) Inventors: Kuo-Chun Lee, San Diego, CA (US); Sivaramakrishna Veerepalli, San Diego, CA (US); Jack Shyh-hurng Shauh, San Diego, CA (US); Shailesh Maheshwari, San Diego, CA (US); Mohan Krishna Gowda, San Diego, CA (US); Ralph Akram Gholmieh, San Diego, CA (US); Nermeen Ahmed Bassiouny, San Diego, CA (US); Pavan Chaithanya Kaivaram, San Diego, CA (US); Ramchandran Srinivasan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 41 days.

(21) Appl. No.: 14/850,313

(22) Filed: Sep. 10, 2015

(65) Prior Publication Data
US 2016/0323061 A1    Nov. 3, 2016

Related U.S. Application Data

(60) Provisional application No. 62/156,002, filed on May 1, 2015.

(51) Int. Cl.
*H04L 1/00* (2006.01)
*H04L 29/06* (2006.01)
(Continued)

(52) U.S. Cl.
CPC ...... *H04L 1/0042* (2013.01); *H03M 13/6547* (2013.01); *H04L 1/0001* (2013.01);
(Continued)

(58) Field of Classification Search
CPC .. H04L 1/0042; H04L 1/0001; H04L 65/4076
See application file for complete search history.

(56) References Cited

U.S. PATENT DOCUMENTS 6,285,681 B1 *  9/2001  Kolze ............... H04L 1/0002
                                                      370/395.5
6,405,340 B1 *  6/2002  Irvin ................. H04L 1/004
                                                      714/758
(Continued)

FOREIGN PATENT DOCUMENTS

EP          1482681 A1    12/2004
WO    WO-2007078252 A2    7/2007

OTHER PUBLICATIONS

Lee Kah Wah and Tan Chee Heng,"Adaptive Bandwidth-Constrained Media-Specific Forward Error Correction for Voice Over Internet Protocol", 2002, IEEE.*
(Continued)

*Primary Examiner* — Joseph D Torres
(74) *Attorney, Agent, or Firm* — Norton Rose Fulbright LLP

(57) ABSTRACT

Dynamic forward error correction (FEC) setting is discussed in which the network determines a FEC percentage for each video segment of a video streaming service, based on consideration of the transfer length of the video segment and the allocated bandwidth. When the transfer length and allocated bandwidth reflect transmission of less than peak bandwidth, the network will determine a higher FEC percentage that uses the otherwise wasted bandwidth to transmit additional redundancy symbols. The additional redundancy symbols increase the error recovery rate when collisions occur between streaming video reception and page monitoring occasions of other networks in multi-network, multi-subscriber identification module (SIM) mobile devices. A network entity may then transmit the dynamic
(Continued)

FEC percentage for each video segment in the file description table (FDT) associated with the video streaming service.

8 Claims, 9 Drawing Sheets

(51) Int. Cl.
*H03M 13/00* (2006.01)
*H04L 12/18* (2006.01)
(52) U.S. Cl.
CPC .......... *H04L 1/0041* (2013.01); *H04L 1/0045* (2013.01); *H04L 12/189* (2013.01); *H04L 65/4076* (2013.01); *H04L 2001/0093* (2013.01)

(56) References Cited

U.S. PATENT DOCUMENTS

| | | | | |
|---|---|---|---|---|
| 6,477,669 | B1* | 11/2002 | Agarwal | H03M 13/6312 714/708 |
| 6,532,562 | B1* | 3/2003 | Chou | H04L 1/0002 714/752 |
| 6,594,798 | B1* | 7/2003 | Chou | H04L 1/0002 714/820 |
| 6,598,200 | B1* | 7/2003 | Greenwood | H03M 13/05 714/774 |
| 6,772,388 | B2* | 8/2004 | Cooper | H04L 12/2801 714/774 |
| 7,278,081 | B1* | 10/2007 | Blair | H04L 1/0083 714/701 |
| 7,698,618 | B2* | 4/2010 | Oliva | H04L 1/0001 714/752 |
| 8,311,135 | B2 | 11/2012 | Suzuki | |
| 8,826,102 | B2 | 9/2014 | Liu et al. | |
| 2004/0187070 | A1* | 9/2004 | LaBerge | H04L 1/0068 714/790 |
| 2006/0218227 | A1* | 9/2006 | Spear | G06Q 30/06 709/203 |
| 2006/0253763 | A1* | 11/2006 | Oliva | H04L 1/0001 714/746 |
| 2007/0180119 | A1* | 8/2007 | Khivesara | H04L 12/1881 709/226 |
| 2014/0304570 | A1 | 10/2014 | Baek et al. | |
| 2015/0085735 | A1 | 3/2015 | Shelby et al. | |
| 2015/0089320 | A1 | 3/2015 | Jeong et al. | |

OTHER PUBLICATIONS

Belda R., et al., "Hybrid Flute/Dash Video Delivery Over Mobile Wireless Networks", transactions on Emerging Telecommunications Technologies, vol. 25, No. 11, Feb. 14, 2014 (Feb. 14, 2014), pp. 1070-1082, XP055281200, ISSN: 2161-3915, DOI: 10.1002/ett.2804, the whole document.

Ericsson: "Considerations on Outer Coding for MBMS", 3GPP Draft, R1-040094, 3rd Generation Partnership Project (3GPP), Mobile Competence Centre, 650, Route Des Lucioles, F-06921 Sophia-Antipolis Cedex, France, vol. RAN WG1, No. Espoo, Finland, Jan. 23, 2004, Jan. 23, 2004 (Jan. 23, 2004), 4 Pages, XP050112003, [retrieved on Jan. 23, 2004] section 5.

International Search Report and Written Opinion—PCT/US2016/022490—ISA/EPO—dated Jun. 29, 2016.

\* cited by examiner

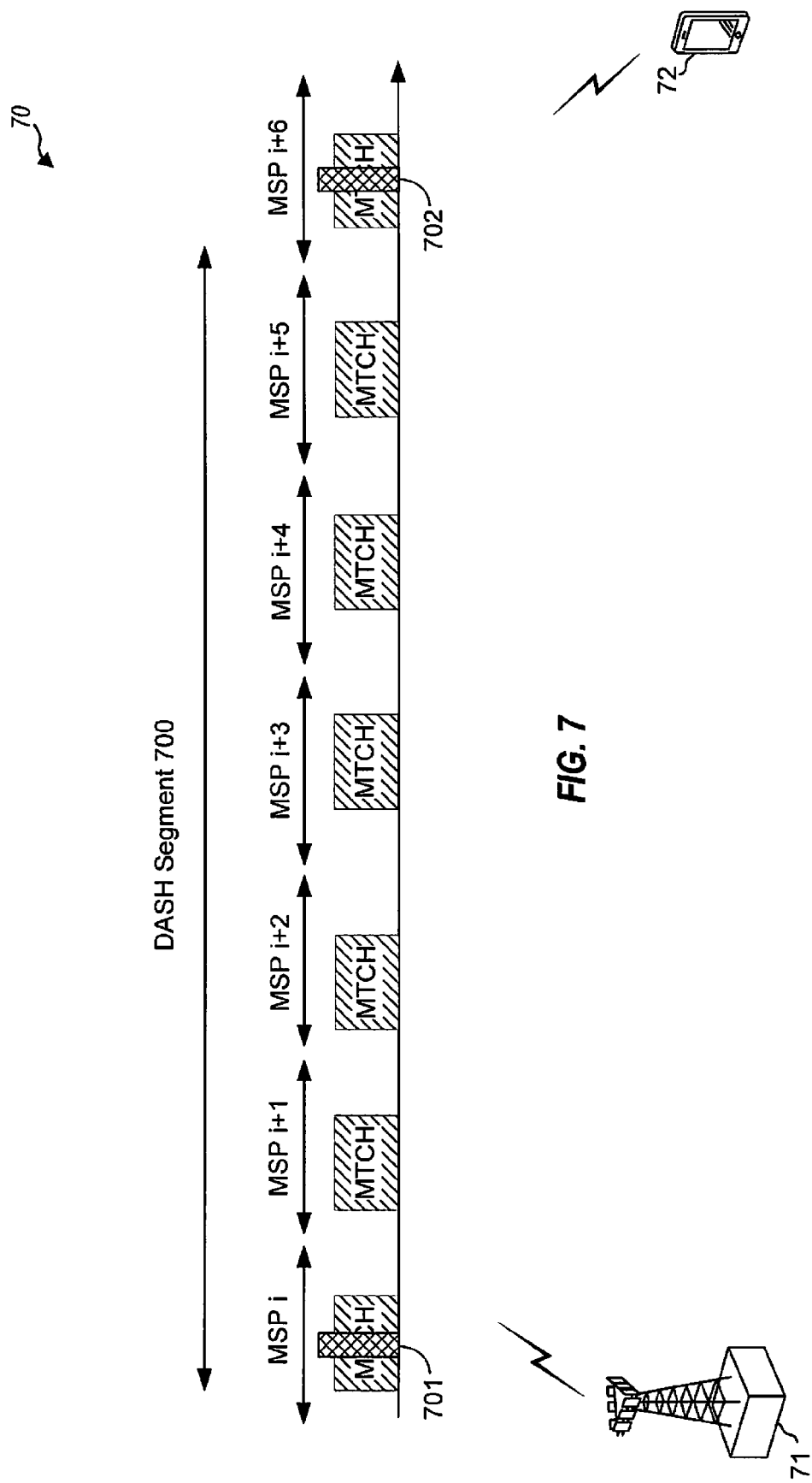

DYNAMIC SETTING OF FEC IN EMBMS VIDEO STREAMING

CROSS-REFERENCE TO RELATED APPLICATIONS

This application claims the benefit of U.S. Provisional Patent Application No. 62/156,002, entitled, DYNAMIC SETTING OF FEC IN EMBMS VIDEO STREAMING," filed on May 1, 2015, which is expressly incorporated by reference herein in its entirety.

BACKGROUND

Field

Aspects of the present disclosure relate generally to wireless communication systems, and more particularly, to dynamic setting of forward error correction (FEC) in enhanced multimedia broadcast-multicast service (eMBMS) video streaming.

Background

Wireless communication networks are widely deployed to provide various communication services such as voice, video, packet data, messaging, broadcast, etc. These wireless networks may be multiple-access networks capable of supporting multiple users by sharing the available network resources. Examples of such multiple-access networks include Code Division Multiple Access (CDMA) networks, Time Division Multiple Access (TDMA) networks, Frequency Division Multiple Access (FDMA) networks, Orthogonal FDMA (OFDMA) networks, and Single-Carrier FDMA (SC-FDMA) networks.

A wireless communication network may include a number of base stations that can support communication for a number of user equipments (UEs), also referred to as mobile entities. A UE may communicate with a base station via a downlink and an uplink. The downlink (or forward link) refers to the communication link from the base station to the UE, and the uplink (or reverse link) refers to the communication link from the UE to the base station. As used herein, a "base station" means an eNode B (eNB), a Node B, a Home Node B, or similar network component of a wireless communications system.

The 3rd Generation Partnership Project (3GPP) Long Term Evolution (LTE) represents a major advance in cellular technology as an evolution of Global System for Mobile communications (GSM) and Universal Mobile Telecommunications System (UMTS). The LTE physical layer (PHY) provides a highly efficient way to convey both data and control information between base stations, such as an evolved Node Bs (eNBs), and mobile entities, such as UEs. In prior applications, a method for facilitating high bandwidth communication for multimedia has been single frequency network (SFN) operation. SFNs utilize radio transmitters, such as, for example, eNBs, to communicate with subscriber UEs. In unicast operation, each eNB is controlled so as to transmit signals carrying information directed to one or more particular subscriber UEs. The specificity of unicast signaling enables person-to-person services such as, for example, voice calling, text messaging, or video calling.

Recent LTE versions support evolved multimedia broadcast-multicast service (eMBMS) in the LTE air interface to provide the video streaming and file download broadcast delivery. For example, video streaming service is expected to be transported by the DASH (Dynamic Adaptive Streaming using HTTP) protocol over FLUTE (File Delivery over Unidirectional Transport) as defined in IETF RFC 3926 over UDP/IP packets. File download service is transported by FLUTE over UDP/IP protocols. Both high layers over IP are processed by the LTE broadcast channels in PHY and L2 (including MAC and RLC layers). However, such transport includes multiple inefficiencies which are not currently addressed in the communications industry.

SUMMARY

In one aspect of the disclosure, a method of wireless communication includes determining, by a network entity, a transfer length of a video object for transmission, wherein the video object is one of a plurality of video objects representing a streaming video service, determining, by the network entity, a forward error correction (FEC) percentage based on the transfer length and an allocated bandwidth, and transmitting the FEC percentage associated with the video object.

In an additional aspect of the disclosure, a method of wireless communication includes tuning, by a mobile device, to receive a multicast-broadcast service in a first radio access technology (RAT), retrieving a FEC percentage associated with the multicast-broadcast service, wherein the FEC percentage is applicable to a current video object of a plurality of video objects defining the multicast-broadcast service, wherein the FEC percentage is dynamically variable among the plurality of video segments, and receiving, at the mobile device, the current video object, wherein the current video object includes source video data symbols and a plurality of FEC symbols, wherein a number of the plurality of FEC symbols is based on the FEC percentage.

In an additional aspect of the disclosure, an apparatus configured for wireless communication includes means for determining, by a network entity, a transfer length of a video object for transmission, wherein the video object is one of a plurality of video objects representing a streaming video service, means for determining, by the network entity, a FEC percentage based on the transfer length and an allocated bandwidth, and means for transmitting the FEC percentage associated with the video object.

In an additional aspect of the disclosure, an apparatus configured for wireless communication includes means for tuning, by a mobile device, to receive a multicast-broadcast service in a first RAT, means for retrieving a FEC percentage associated with the multicast-broadcast service, wherein the FEC percentage is applicable to a current video object of a plurality of video objects defining the multicast-broadcast service, wherein the FEC percentage is dynamically variable among the plurality of video segments, and means for receiving, at the mobile device, the current video object, wherein the current video object includes source video data symbols and a plurality of FEC symbols, wherein a number of the plurality of FEC symbols is based on the FEC percentage.

In an additional aspect of the disclosure, a non-transitory computer-readable medium having program code recorded thereon. The program code further includes code to determine, by a network entity, a transfer length of a video object for transmission, wherein the video object is one of a plurality of video objects representing a streaming video service, code to determine, by the network entity, a FEC percentage based on the transfer length and an allocated bandwidth, and code to transmit the FEC percentage associated with the video object.

In an additional aspect of the disclosure, a non-transitory computer-readable medium having program code recorded thereon. The program code further includes code to tune, by a mobile device, to receive a multicast-broadcast service in a first RAT, code to retrieve a FEC percentage associated with the multicast-broadcast service, wherein the FEC percentage is applicable to a current video object of a plurality of video objects defining the multicast-broadcast service, wherein the FEC percentage is dynamically variable among the plurality of video segments, and code to receive, at the mobile device, the current video object, wherein the current video object includes source video data symbols and a plurality of FEC symbols, wherein a number of the plurality of FEC symbols is based on the FEC percentage.

In an additional aspect of the disclosure, an apparatus configured for wireless communication is disclosed. The apparatus includes at least one processor, and a memory coupled to the processor. The processor is configured to determine, by a network entity, a transfer length of a video object for transmission, wherein the video object is one of a plurality of video objects representing a streaming video service, to determine, by the network entity, a FEC percentage based on the transfer length and an allocated bandwidth, and to transmit the FEC percentage associated with the video object.

In an additional aspect of the disclosure, an apparatus configured for wireless communication is disclosed. The apparatus includes at least one processor, and a memory coupled to the processor. The processor is configured to tune, by a mobile device, to receive a multicast-broadcast service in a first RAT, to retrieve a FEC percentage associated with the multicast-broadcast service, wherein the FEC percentage is applicable to a current video object of a plurality of video objects defining the multicast-broadcast service, wherein the FEC percentage is dynamically variable among the plurality of video segments, and to receive, at the mobile device, the current video object, wherein the current video object includes source video data symbols and a plurality of FEC symbols, wherein a number of the plurality of FEC symbols is based on the FEC percentage.

The foregoing has outlined rather broadly the features and technical advantages of the present application in order that the detailed description that follows may be better understood. Additional features and advantages will be described hereinafter which form the subject of the claims. It should be appreciated by those skilled in the art that the conception and specific aspect disclosed may be readily utilized as a basis for modifying or designing other structures for carrying out the same purposes of the present application. It should also be realized by those skilled in the art that such equivalent constructions do not depart from the spirit and scope of the present application and the appended claims. The novel features which are believed to be characteristic of aspects, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present claims.

BRIEF DESCRIPTION OF THE DRAWINGS

FIG. 7 is a block diagram illustrating a communication stream including a network entity and a UE.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

The techniques described herein may be used for various wireless communication networks such as CDMA, TDMA, FDMA, OFDMA, SC-FDMA and other networks. The terms "network" and "system" are often used interchangeably. A CDMA network may implement a radio technology such as Universal Terrestrial Radio Access (UTRA), CDMA2000, etc. UTRA includes Wideband CDMA (WCDMA) and other variants of CDMA. CDMA2000 covers IS-2000, IS-95 and IS-856 standards. A TDMA network may implement a radio technology such as Global System for Mobile Communications (GSM). An OFDMA network may implement a radio technology such as Evolved UTRA (E-UTRA), Ultra Mobile Broadband (UMB), IEEE 802.11 (Wi-Fi), IEEE 802.16 (WiMAX), IEEE 802.20, Flash-OFDMA, etc. UTRA and E-UTRA are part of Universal Mobile Telecommunication System (UMTS). 3GPP Long Term Evolution (LTE) and LTE-Advanced (LTE-A) are new releases of UMTS that use E-UTRA. UTRA, E-UTRA, UMTS, LTE, LTE-A and GSM are described in documents from an organization named "3rd Generation Partnership Project" (3GPP). CDMA2000 and UMB are described in documents from an organization named "3rd Generation Partnership Project 2" (3GPP2). The techniques described herein may be used for the wireless networks and radio technologies mentioned above as well as other wireless networks and radio technologies. For clarity, certain aspects of the techniques are described below for LTE, and LTE terminology is used in much of the description below.

Figure 1:
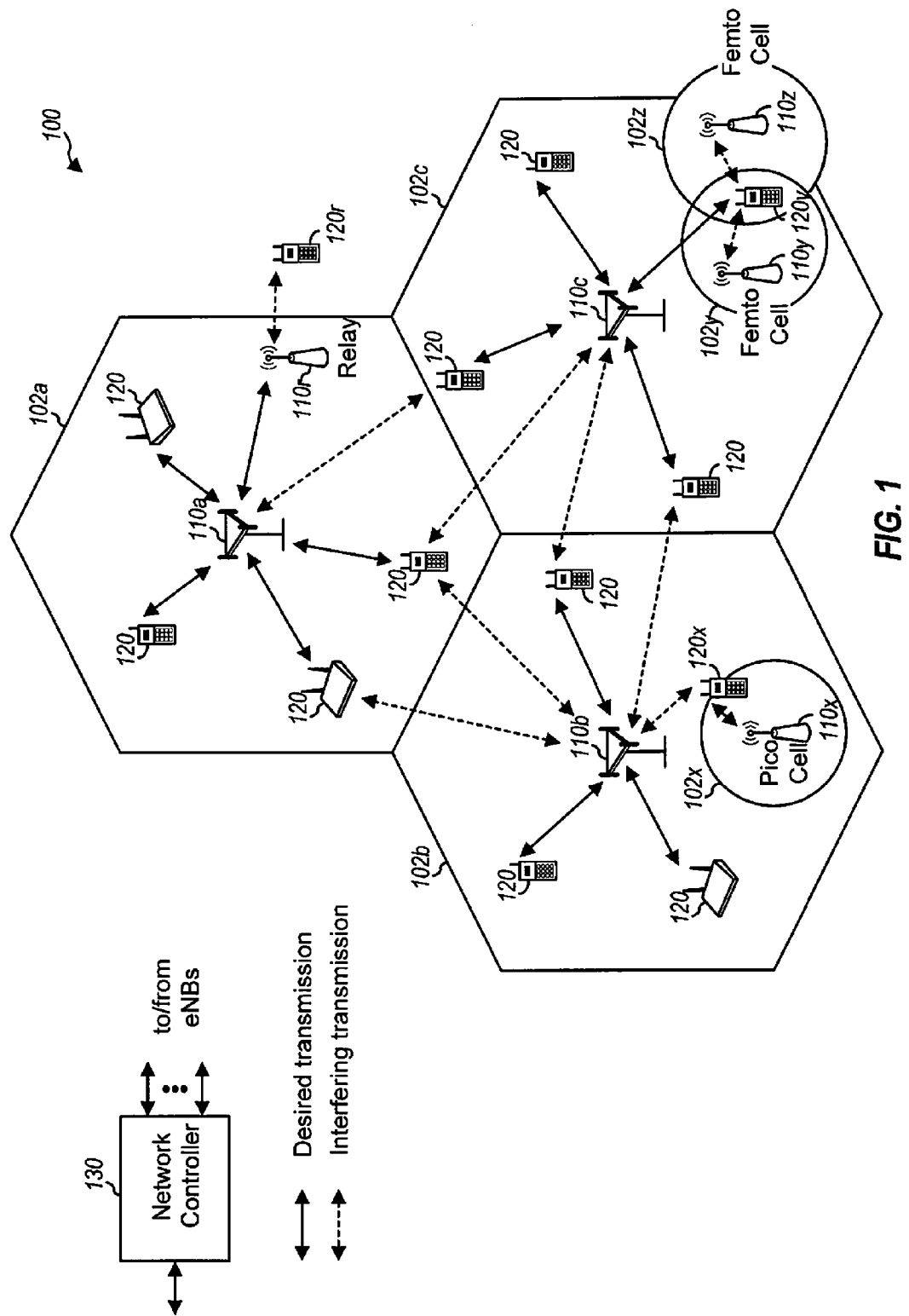
FIG. 1 is a block diagram conceptually illustrating an example of a telecommunications system.

FIG. 1 shows a wireless communication network 100, which may be an LTE network. The wireless network 100 may include a number of eNBs 110 and other network entities. An eNB may be a station that communicates with the UEs and may also be referred to as a base station, a Node B, an access point, or other term. Each eNB 110a, 110b, 110c may provide communication coverage for a particular geographic area. In 3GPP, the term "cell" can refer to a coverage area of an eNB and/or an eNB subsystem serving this coverage area, depending on the context in which the term is used.

An eNB may provide communication coverage for a macro cell, a pico cell, a femto cell, and/or other types of cell. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having association with the femto cell (e.g., UEs in a Closed Subscriber Group (CSG), UEs for users in the home, etc.). An eNB for a macro cell may be referred to as a macro eNB. An eNB for a pico cell may be referred to as a pico eNB. An eNB for a femto cell may be referred to as a femto eNB or a home eNB (HNB). In the example shown in FIG. 1, the eNBs 110a, 110b and 110c may be macro eNBs for the macro cells 102a, 102b and 102c, respectively. The eNB 110x may be a pico eNB for a pico cell 102x, serving a UE 120x. The eNBs 110y and 110z may be femto eNBs for the femto cells 102y and 102z, respectively. An eNB may support one or multiple (e.g., three) cells.

The wireless network 100 may also include relay stations 110r. A relay station is a station that receives a transmission of data and/or other information from an upstream station (e.g., an eNB or a UE) and sends a transmission of the data and/or other information to a downstream station (e.g., a UE or an eNB). A relay station may also be a UE that relays transmissions for other UEs. In the example shown in FIG. 1, a relay station 110r may communicate with the eNB 110a and a UE 120r in order to facilitate communication between the eNB 110a and the UE 120r. A relay station may also be referred to as a relay eNB, a relay, etc.

The wireless network 100 may be a heterogeneous network that includes eNBs of different types, e.g., macro eNBs, pico eNBs, femto eNBs, relays, etc. These different types of eNBs may have different transmit power levels, different coverage areas, and different impact on interference in the wireless network 100. For example, macro eNBs may have a high transmit power level (e.g., 20 Watts) whereas pico eNBs, femto eNBs and relays may have a lower transmit power level (e.g., 1 Watt).

The wireless network 100 may support synchronous or asynchronous operation. For synchronous operation, the eNBs may have similar frame timing, and transmissions from different eNBs may be approximately aligned in time. For asynchronous operation, the eNBs may have different frame timing, and transmissions from different eNBs may not be aligned in time. The techniques described herein may be used for both synchronous and asynchronous operation.

A network controller 130 may couple to a set of eNBs and provide coordination and control for these eNBs. The network controller 130 may communicate with the eNBs 110 via a backhaul. The eNBs 110 may also communicate with one another, e.g., directly or indirectly via wireless or wireline backhaul.

The UEs 120 may be dispersed throughout the wireless network 100, and each UE may be stationary or mobile. A UE may also be referred to as a terminal, a mobile station, a subscriber unit, a station, etc. A UE may be a cellular phone, a personal digital assistant (PDA), a wireless modem, a wireless communication device, a handheld device, a laptop computer, a cordless phone, a wireless local loop (WLL) station, a smart phone, a tablet, or other mobile entities. A UE may be able to communicate with macro eNBs, pico eNBs, femto eNBs, relays, or other network entities. In FIG. 1, a solid line with double arrows indicates desired transmissions between a UE and a serving eNB, which is an eNB designated to serve the UE on the downlink and/or uplink. A dashed line with double arrows indicates interfering transmissions between a UE and an eNB.

LTE utilizes orthogonal frequency division multiplexing (OFDM) on the downlink and single-carrier frequency division multiplexing (SC-FDM) on the uplink. OFDM and SC-FDM partition the system bandwidth into multiple (K) orthogonal subcarriers, which are also commonly referred to as tones, bins, etc. Each subcarrier may be modulated with data. In general, modulation symbols are sent in the frequency domain with OFDM and in the time domain with SC-FDM. The spacing between adjacent subcarriers may be fixed, and the total number of subcarriers (K) may be dependent on the system bandwidth. For example, K may be equal to 128, 256, 512, 1024 or 2048 for system bandwidth of 1.25, 2.5, 5, 10 or 20 megahertz (MHz), respectively. The system bandwidth may also be partitioned into subbands. For example, a subband may cover 1.08 MHz, and there may be 1, 2, 4, 8 or 16 subbands for system bandwidth of 1.25, 2.5, 5, 10 or 20 MHz, respectively.

Figure 2:
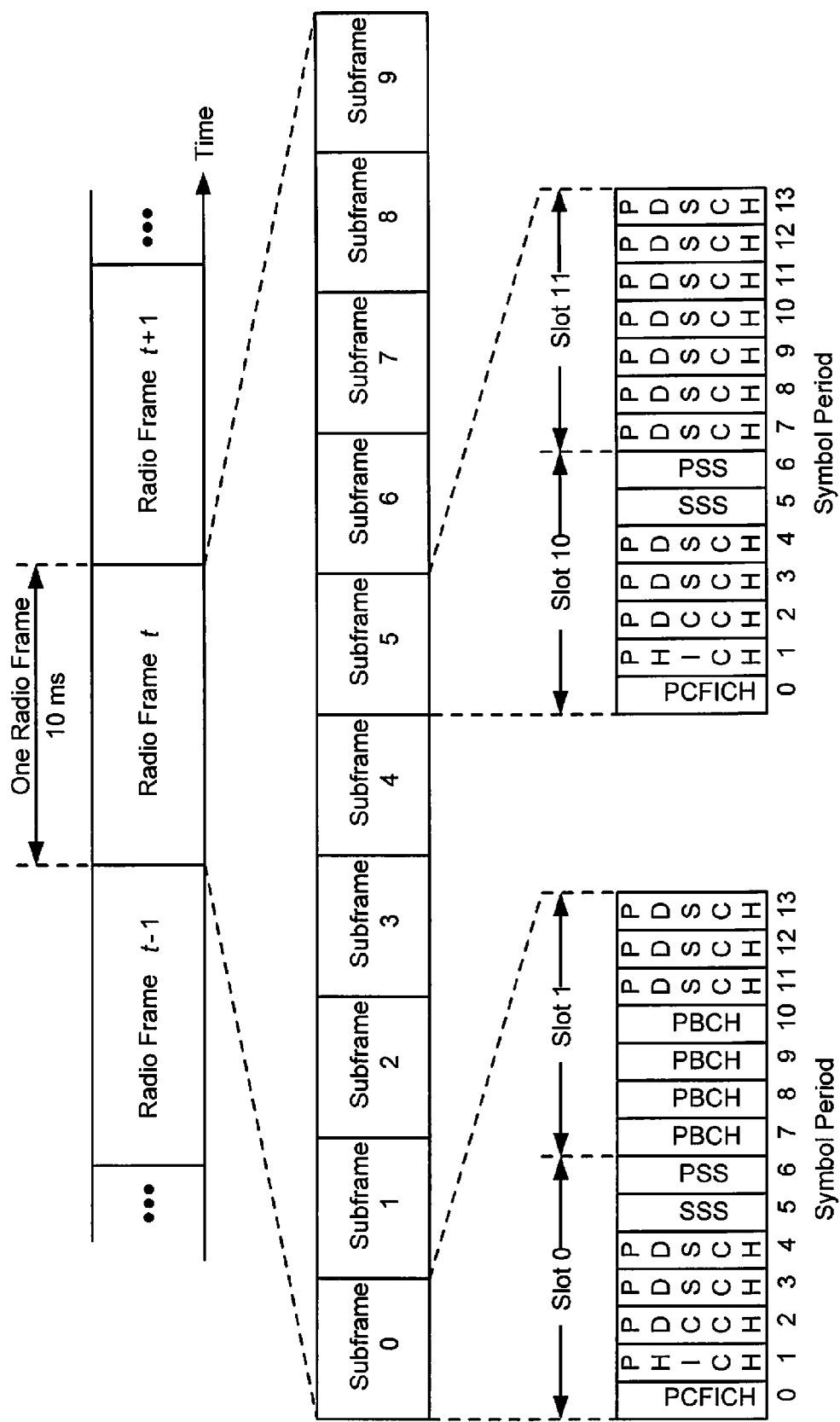
FIG. 2 is a block diagram conceptually illustrating an example of a down link frame structure in a telecommunications system.
Figure 6:
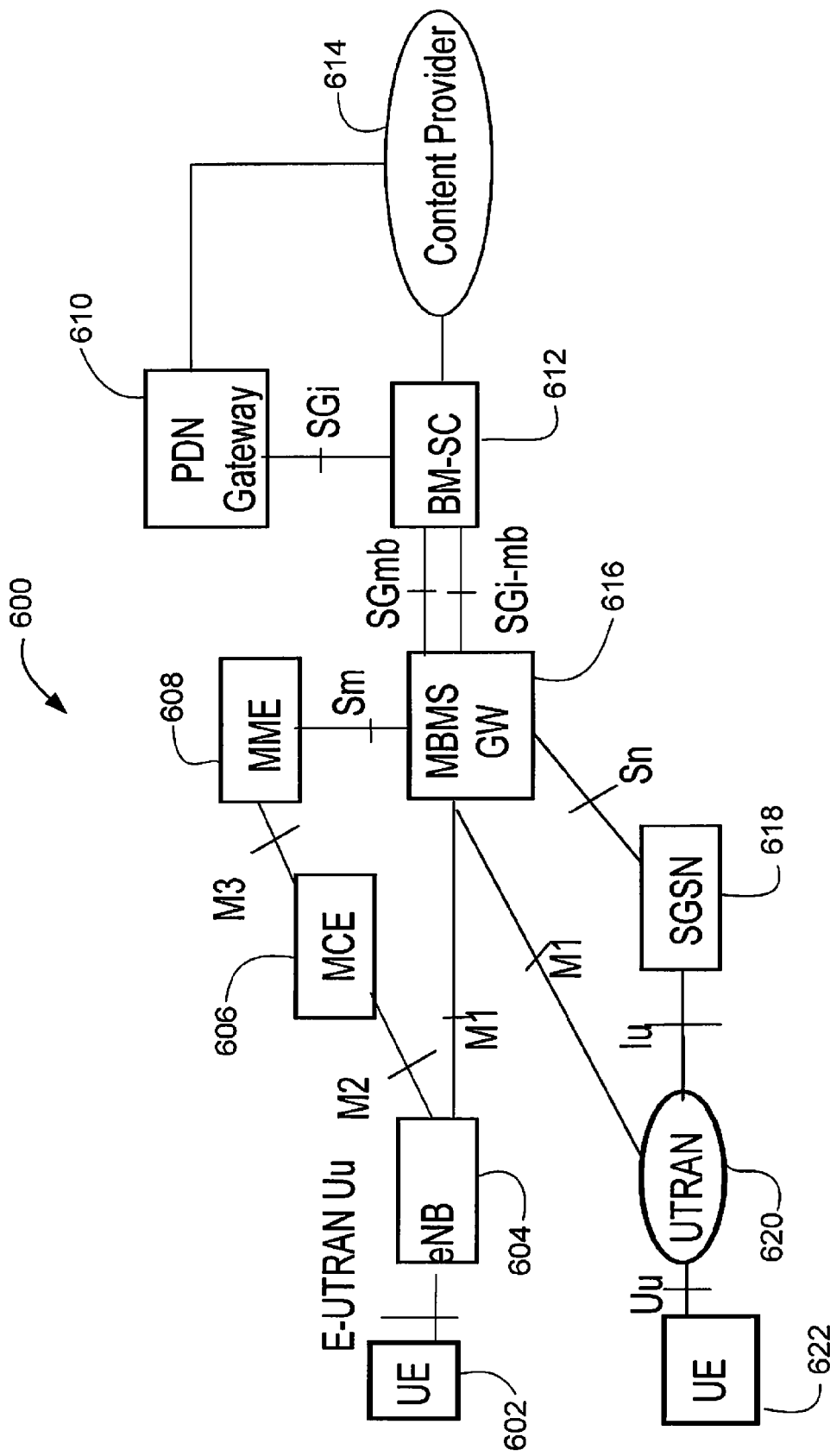
FIG. 6 is a block diagram illustrating components of a wireless communication system for providing or supporting MBSFN service.

FIG. 2 shows a down link frame structure used in LTE. The transmission timeline for the downlink may be partitioned into units of radio frames. Each radio frame may have a predetermined duration (e.g., 10 milliseconds (ms)) and may be partitioned into 10 subframes with indices of 0 through 9. Each subframe may include two slots. Each radio frame may thus include 20 slots with indices of 0 through 19. Each slot may include L symbol periods, e.g., 7 symbol periods for a normal cyclic prefix (CP), as shown in FIG. 2, or 6 symbol periods for an extended cyclic prefix. The normal CP and extended CP may be referred to herein as different CP types. The 2L symbol periods in each subframe may be assigned indices of 0 through 2L−1. The available time frequency resources may be partitioned into resource blocks. Each resource block may cover N subcarriers (e.g., 12 subcarriers) in one slot.

In LTE, an eNB may send a primary synchronization signal (PSS) and a secondary synchronization signal (SSS) for each cell in the eNB. The primary and secondary synchronization signals may be sent in symbol periods 6 and 5, respectively, in each of subframes 0 and 5 of each radio frame with the normal cyclic prefix, as shown in FIG. 2. The synchronization signals may be used by UEs for cell detection and acquisition. The eNB may send a Physical Broadcast Channel (PBCH) in symbol periods 0 to 3 in slot 1 of subframe 0. The PBCH may carry certain system information.

The eNB may send a Physical Control Format Indicator Channel (PCFICH) in only a portion of the first symbol period of each subframe, although depicted in the entire first symbol period in FIG. 2. The PCFICH may convey the number of symbol periods (M) used for control channels, where M may be equal to 1, 2 or 3 and may change from subframe to subframe. M may also be equal to 4 for a small system bandwidth, e.g., with less than 10 resource blocks. In the example shown in FIG. 2, M=3. The eNB may send a Physical HARQ Indicator Channel (PHICH) and a Physical Downlink Control Channel (PDCCH) in the first M symbol periods of each subframe (M=3 in FIG. 2). The PHICH may carry information to support hybrid automatic retransmission (HARQ). The PDCCH may carry information on resource allocation for UEs and control information for downlink channels. Although not shown in the first symbol period in FIG. 2, it is understood that the PDCCH and PHICH are also included in the first symbol period. Similarly, the PHICH and PDCCH are also both in the second and third symbol periods, although not shown that way in FIG. 2. The eNB may send a Physical Downlink Shared Channel (PDSCH) in the remaining symbol periods of each subframe. The PDSCH may carry data for UEs scheduled for data transmission on the downlink. The various signals and channels in LTE are described in 3GPP TS 36.211, entitled "Evolved Universal Terrestrial Radio Access (E-UTRA); Physical Channels and Modulation," which is publicly available.

The eNB may send the PSS, SSS and PBCH in the center 1.08 MHz of the system bandwidth used by the eNB. The eNB may send the PCFICH and PHICH across the entire system bandwidth in each symbol period in which these channels are sent. The eNB may send the PDCCH to groups of UEs in certain portions of the system bandwidth. The eNB may send the PDSCH to specific UEs in specific portions of the system bandwidth. The eNB may send the PSS, SSS, PBCH, PCFICH and PHICH in a broadcast manner to all UEs, may send the PDCCH in a unicast manner to specific UEs, and may also send the PDSCH in a unicast manner to specific UEs.

A number of resource elements may be available in each symbol period. Each resource element may cover one subcarrier in one symbol period and may be used to send one modulation symbol, which may be a real or complex value. Resource elements not used for a reference signal in each symbol period may be arranged into resource element groups (REGs). Each REG may include four resource elements in one symbol period. The PCFICH may occupy four REGs, which may be spaced approximately equally across frequency, in symbol period 0. The PHICH may occupy three REGs, which may be spread across frequency, in one or more configurable symbol periods. For example, the three REGs for the PHICH may all belong in symbol period 0 or may be spread in symbol periods 0, 1 and 2. The PDCCH may occupy 9, 18, 32 or 64 REGs, which may be selected from the available REGs, in the first M symbol periods. Only certain combinations of REGs may be allowed for the PDCCH.

A UE may know the specific REGs used for the PHICH and the PCFICH. The UE may search different combinations of REGs for the PDCCH. The number of combinations to search is typically less than the number of allowed combinations for the PDCCH. An eNB may send the PDCCH to the UE in any of the combinations that the UE will search.

A UE may be within the coverage of multiple eNBs. One of these eNBs may be selected to serve the UE. The serving eNB may be selected based on various criteria such as received power, path loss, signal-to-noise ratio (SNR), etc.

Figure 3:
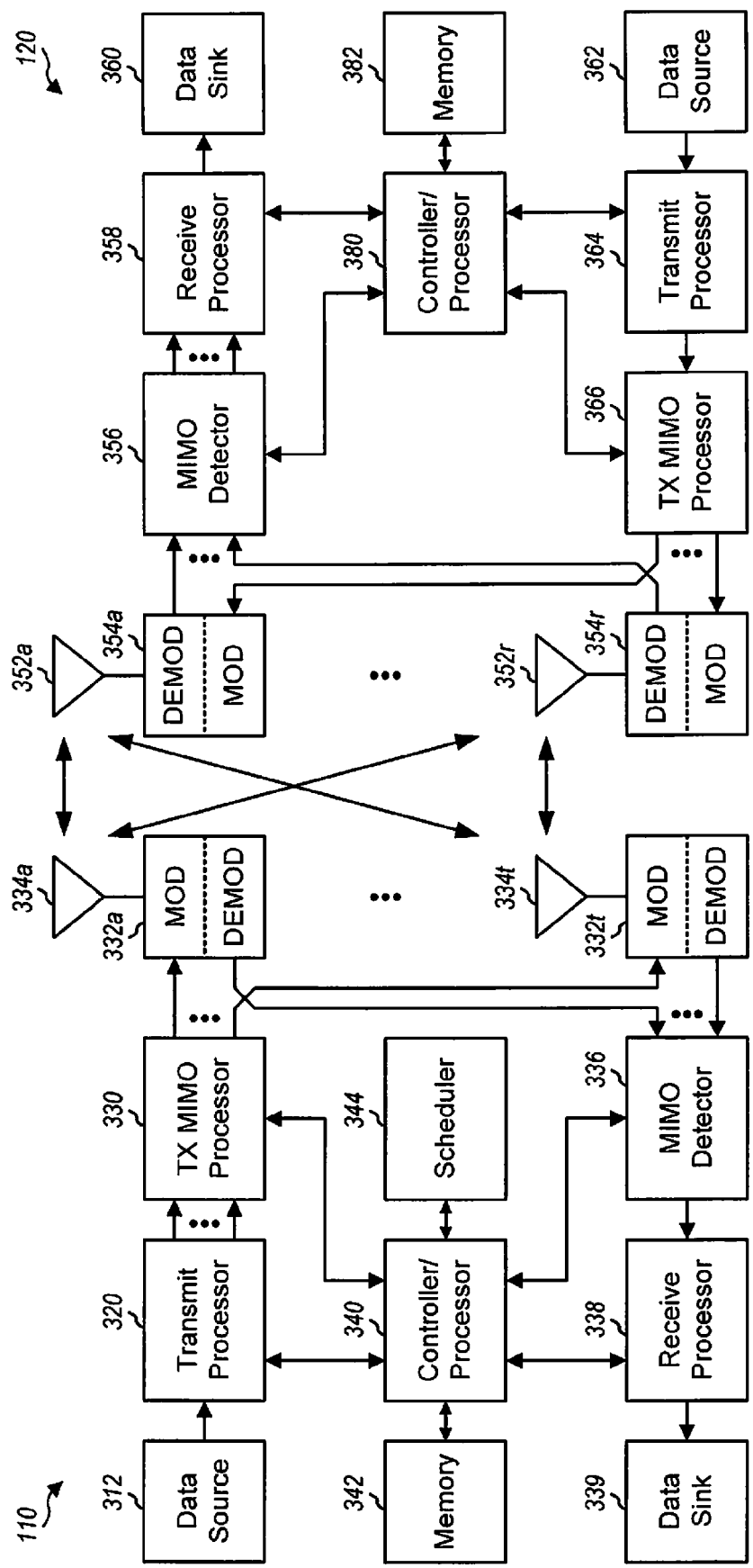
FIG. 3 is a block diagram conceptually illustrating a design of a base station/eNB and a UE configured according to one aspect of the present disclosure.

FIG. 3 shows a block diagram of a design of a base station/eNB 110 and a UE 120, which may be one of the base stations/eNBs and one of the UEs in FIG. 1. For a restricted association scenario, the base station 110 may be the macro eNB 110c in FIG. 1, and the UE 120 may be the UE 120y. The base station 110 may also be a base station of some other type. The base station 110 may be equipped with antennas 334a through 334t, and the UE 120 may be equipped with antennas 352a through 352r.

At the base station 110, a transmit processor 320 may receive data from a data source 312 and control information from a controller/processor 340. The control information may be for the PBCH, PCFICH, PHICH, PDCCH, etc. The data may be for the PDSCH, etc. The processor 320 may process (e.g., encode and symbol map) the data and control information to obtain data symbols and control symbols, respectively. The processor 320 may also generate reference symbols, e.g., for the PSS, SSS, and cell-specific reference signal. A transmit (TX) multiple-input multiple-output (MIMO) processor 330 may perform spatial processing (e.g., precoding) on the data symbols, the control symbols, and/or the reference symbols, if applicable, and may provide output symbol streams to the modulators/demodulators (MODs/DEMODs) 332a through 332t. Each modulator/demodulator 332 may process a respective output symbol stream (e.g., for OFDM, etc.) to obtain an output sample stream. Each modulator/demodulator 332 may further process (e.g., convert to analog, amplify, filter, and upconvert) the output sample stream to obtain a downlink signal. Downlink signals from modulators/demodulators 332a through 332t may be transmitted via the antennas 334a through 334t, respectively.

At the UE 120, the antennas 352a through 352r may receive the downlink signals from the base station 110 and may provide received signals to the demodulators/modulators (DEMODs/MODs) 354a through 354r, respectively. Each demodulator/modulator 354 may condition (e.g., filter, amplify, downconvert, and digitize) a respective received signal to obtain input samples. Each demodulator/modulator 354 may further process the input samples (e.g., for OFDM, etc.) to obtain received symbols. A MIMO detector 356 may obtain received symbols from all the demodulators/modulators 354a through 354r, perform MIMO detection on the received symbols if applicable, and provide detected symbols. A receive processor 358 may process (e.g., demodulate, deinterleave, and decode) the detected symbols, provide decoded data for the UE 120 to a data sink 360, and provide decoded control information to a controller/processor 380.

On the uplink, at the UE 120, a transmit processor 364 may receive and process data (e.g., for the PUSCH) from a data source 362 and control information (e.g., for the PUCCH) from the controller/processor 380. The processor 364 may also generate reference symbols for a reference signal. The symbols from the transmit processor 364 may be precoded by a TX MIMO processor 366 if applicable, further processed by the demodulators/modulators 354a through 354r (e.g., for SC-FDM, etc.), and transmitted to the base station 110. At the base station 110, the uplink signals from the UE 120 may be received by the antennas 334, processed by the modulators/demodulators 332, detected by a MIMO detector 336 if applicable, and further processed by a receive processor 338 to obtain decoded data and control information sent by the UE 120. The processor 338 may provide the decoded data to a data sink 339 and the decoded control information to the controller/processor 340.

The controllers/processors 340 and 380 may direct the operation at the base station 110 and the UE 120, respectively. The processor 340 and/or other processors and modules at the base station 110 may perform or direct the execution of various processes for the techniques described herein. The processor 380 and/or other processors and modules at the UE 120 may also perform or direct the execution of the functional blocks illustrated in FIGS. 4 and 5, and/or other processes for the techniques described herein. The memories 342 and 382 may store data and program codes for the base station 110 and the UE 120, respectively. A scheduler 344 may schedule UEs for data transmission on the downlink and/or uplink.

In one configuration, the UE 120 for wireless communication includes means for detecting interference from an interfering base station during a connection mode of the UE, means for selecting a yielded resource of the interfering base station, means for obtaining an error rate of a physical downlink control channel on the yielded resource, and means, executable in response to the error rate exceeding a predetermined level, for declaring a radio link failure. In one aspect, the aforementioned means may be the processor(s), the controller/processor 380, the memory 382, the receive processor 358, the MIMO detector 356, the demodulators/modulators 354a, and the antennas 352a configured to perform the functions recited by the aforementioned means. In another aspect, the aforementioned means may be a module or any apparatus configured to perform the functions recited by the aforementioned means.

eMBMS and Unicast Signaling in Single Frequency Networks:

One technique to facilitate high bandwidth communication for multimedia has been single frequency network (SFN) operation. Particularly, Multimedia Broadcast Multicast Service (MBMS) and MBMS for LTE, also known as evolved MBMS (eMBMS) (including, for example, what has recently come to be known as multimedia broadcast single frequency network (MBSFN) in the LTE context), can utilize such SFN operation. SFNs utilize radio transmitters, such as, for example, eNBs, to communicate with subscriber UEs. Groups of eNBs can transmit information in a synchronized manner, so that signals reinforce one another rather than interfere with each other. In the context of eMBMS, the shared content is transmitted from multiple eNB's of a LTE network to multiple UEs. Therefore, within a given eMBMS area, a UE may receive eMBMS signals from any eNB(s) within radio range as part of the eMBMS service area or MBSFN area. However, to decode the eMBMS signal each UE receives Multicast Control Channel (MCCH) information from a serving eNB over a non-eMBMS channel. MCCH information changes from time to time and notification of changes is provided through another non-eMBMS channel, the PDCCH. Therefore, to decode eMBMS signals within a particular eMBMS area, each UE is served MCCH and PDCCH signals by one of the eNBs in the area.

In accordance with aspects of the subject of this disclosure, there is provided a wireless network (e.g., a 3GPP network) having features relating to single carrier optimization for eMBMS. eMBMS provides an efficient way to transmit shared content from an LTE network to multiple mobile entities, such as, for example, UEs.

With respect a physical layer (PHY) of eMBMS for LTE Frequency Division Duplex (FDD), the channel structure may comprise time division multiplexing (TDM) resource partitioning between eMBMS and unicast transmissions on mixed carriers, thereby allowing flexible and dynamic spectrum utilization. Currently, a subset of subframes (up to 60%), known as multimedia broadcast single frequency network (MBSFN) subframes, can be reserved for eMBMS transmission. As such current eMBMS design allows at most six out of ten subframes for eMBMS.

Figure 4:
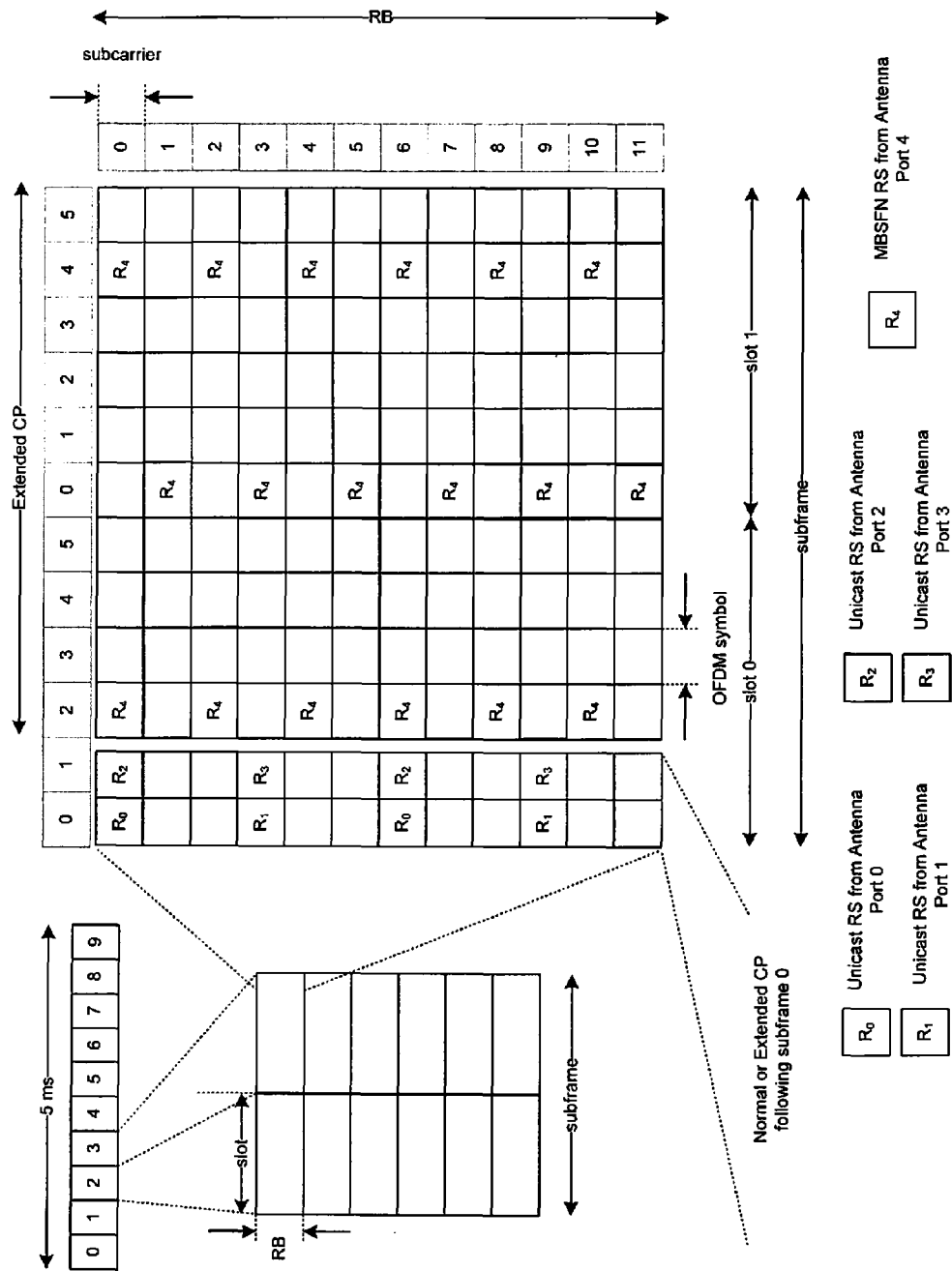
FIG. 4 is a diagram of a signaling frame illustrating an example of symbol allocation for unicast and multicast signals.

An example of subframe allocation for eMBMS is shown in FIG. 4, which shows an existing allocation of MBSFN reference signals on MBSFN subframes, for a single-carrier case. Components depicted in FIG. 4 correspond to those shown in FIG. 2, with FIG. 4 showing the individual subcarriers within each slot and resource block (RB). In 3GPP LTE, an RB spans 12 subcarriers over a slot duration of 0.5 ms, with each subcarrier having a bandwidth of 15 kHz together spanning 180 kHz per RB. Subframes may be allocated for unicast or eMBMS; for example in a sequence of subframes labeled 0, 1, 2, 3, 4, 5, 6, 7, 8, and 9, subframes 0, 4, 5, and 9 may be excluded from eMBMS in FDD. Also, subframes 0, 1, 5, and 6 may be excluded from eMBMS in time division duplex (TDD). More specifically, subframes 0, 4, 5, and 9 may be used for PSS/SSS/PBCH/paging/system information blocks (SIBS); and unicast service. Remaining subframes in the sequence, e.g., subframes 1, 2, 3, 6, 7, and 8 may be configured as eMBMS subframes.

Figure 5:
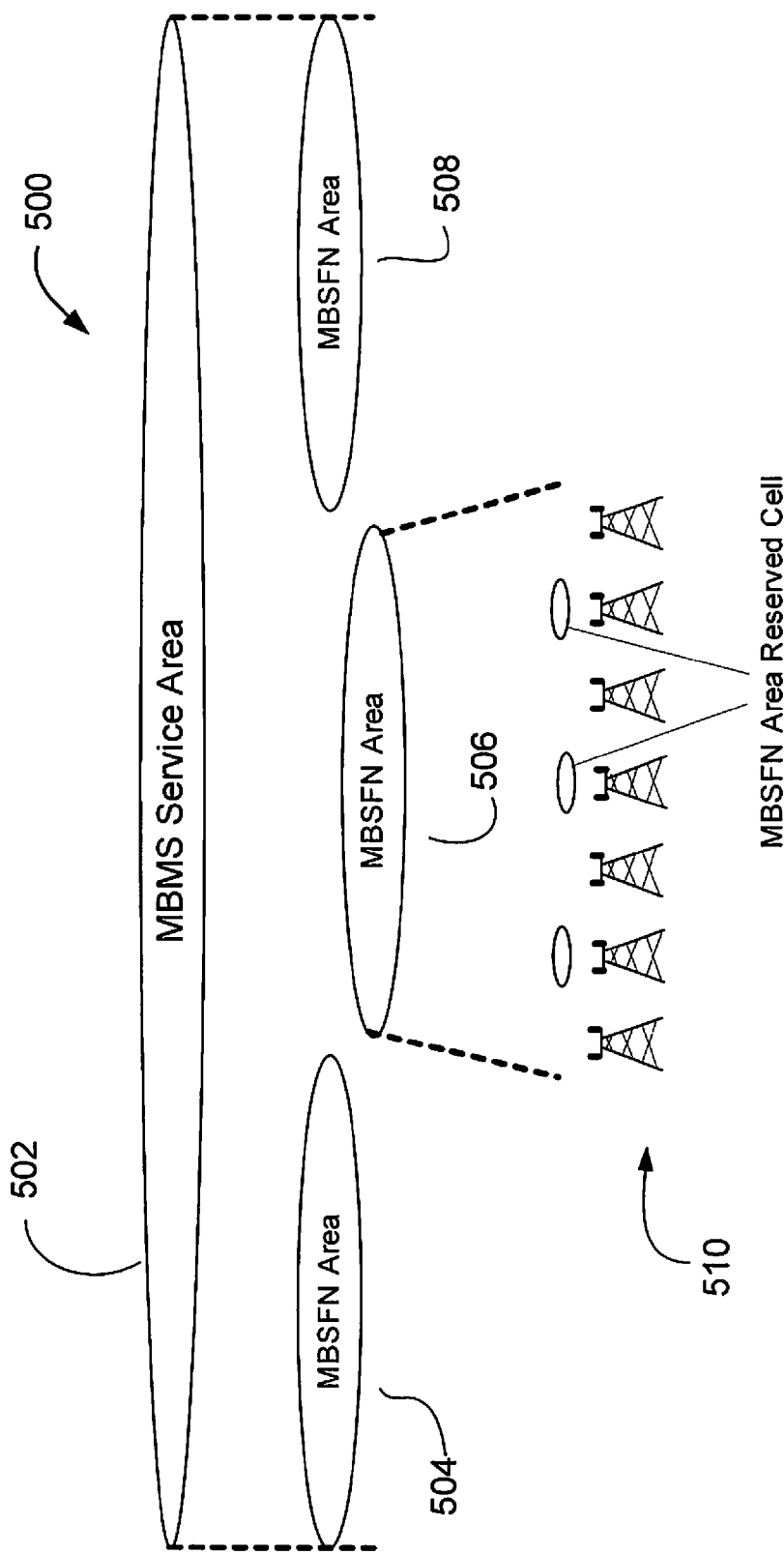
FIG. 5 is a diagram illustrating MBMS over a Single Frequency Network (MBSFN) areas within an MBSFN service area.

With continued reference to FIG. 4, within each eMBMS subframe, the first 1 or 2 symbols may be used for unicast reference symbols (RSs) and control signaling. A CP length of the first 1 or 2 symbols may follow that of subframe 0. A transmission gap may occur between the first 1 or 2 symbols and the eMBMS symbols if the CP lengths are different. Known techniques for providing MBSFN RSs and unicast RSs typically involve allocating the MBSFN RSs on MBSFN subframes (as shown in FIG. 4), and separately allocating unicast RSs on non-MBSFN subframes. More specifically, as FIG. 4 shows, the extended CP of the MBSFN subframe includes MBSFN RSs but not unicast RSs. The present technology is not limited to the particular frame allocation scheme illustrated by FIGS. 2 and 4, which are presented by way of example, and not by way of limitation. A multicast session or multicast broadcast as used herein may use any suitable frame allocation scheme.

eMBMS Service Areas:

FIG. 5 illustrates a system 500 including an MBMS service area 502 encompassing multiple MBSFN areas 504, 506, 508, which themselves include multiple cells or base stations 510. As used herein, an "MBMS service area" refers to a group of wireless transmission cells where a certain MBMS service is available. For example, a particular sports or other program may be broadcast by base stations within the MBMS service area at a particular time. The area where the particular program is broadcast defines the MBMS service area. The MBMS service area may be made up of one or more "MBSFN areas" as shown at 504, 506 and 508. As used herein, an MBSFN area refers to a group of cells (e.g., cells 510) currently broadcasting a particular program in a synchronized fashion using an MBSFN protocol. An "MBSFN synchronization area" refers to a group of cells that are interconnected and configured in a way such that they are capable of operating in a synchronized fashion to broadcast a particular program using an MBSFN protocol, regardless of whether or not they are currently doing so. Each eNB can belong to only one MBSFN synchronization area, on a given frequency layer. It is worth noting that an MBMS service area 502 may include one or more MBSFN synchronization areas (not shown). Conversely, an MBSFN synchronization area may include one or more MBSFN areas or MBMS service areas. Generally, an MBSFN area is made up of all, or a portion of, a single MBSFN synchronization area and is located within a single MBMS service area. Overlap between various MBSFN areas is supported, and a single eNB may belong to several different MBSFN areas. For example, up to 8 independent MCCHs may be configured in System Information Block (SIB) 13 to support membership in different MBSFN areas. An MBSFN Area Reserved Cell or Base Station is a cell/base station within a MBSFN Area that does not contribute to the MBSFN transmission, for example a cell near a MBSFN Synchronization Area boundary, or a cell that that is not needed for MBSFN transmission because of its location.

eMBMS System Components and Functions:

FIG. 6 illustrates functional entities of a wireless communication system 600 for providing or supporting MBSFN service. Regarding Quality of Service (QoS), the system 600 may use a Guaranteed Bit Rate (GBR) type MBMS bearer, wherein the Maximum Bit Rate (MBR) equals the GBR. These components are shown and described by way of example, and do not limit the inventive concepts described herein, which may be adopted to other architectures and functional distributions for delivering and controlling multicast transmissions.

The system 600 may include an MBMS Gate Way (MBMS GW) 616. The MBMS GW 616 controls Internet Protocol (IP) multicast distribution of MBMS user plane data to eNodeBs 604 via an M1 interface; one eNB 604 of many possible eNBs is shown. In addition, the MBMS GW controls IP multicast distribution of MBMS user plane data to UTRAN 620 via an M1 interface. The M1 interface is associated to MBMS data (user plane) and makes use of IP for delivery of data packets. The eNB 604 may provide MBMS content to a user equipment (UE)/mobile entity 602 via an E-UTRAN Uu interface. The UTRAN 620 may provide MBMS content to a UE mobile entity 622 via a Uu interface. The MBMS GW 616 may further perform MBMS Session Control Signaling, for example MBMS session start and session stop, via the Mobility Management Entity (MME) 608 and Sm interface. The MBMS GW 616 may further provide an interface for entities using MBMS bearers through the SG-mb (user plane) reference point, and provide an interface for entities using MBMS bearers through the SGi-mb (control plane) reference point. The SG-mb Interface carries MBMS bearer service specific signaling. The SGi-mb interface is a user plane interface for MBMS data delivery. MBMS data delivery may be performed by IP unicast transmission, which may be a default mode, or by IP multicasting. The MBMS GW 616 may provide a control plane function for MBMS over UTRAN via a Serving General Packet Radio Service Support Node (SGSN) 618 and the Sn/Iu interfaces.

The system 600 may further include a Multicast Coordinating Entity (MCE) 606. The MCE 606 may perform an admission control function form MBMS content, and allocate time and frequency radio resources used by all eNBs in the MBSFN area for multi-cell MBMS transmissions using MBSFN operation. The MCE 606 may determine a radio configuration for an MBSFN Area, such as, for example, the modulation and coding scheme. The MCE 606 may schedule and control user plane transmission of MBMS content, and manage eMBMS service multiplexing, by determining which services are to be multiplexed in which Multicast Channel (MCH). The MCE 606 may participate in MBMS Session Control Signaling with the MME 608 through an M3 interface, and may provide a control plane interface M2 with the eNB 604.

The system 600 may further include a Broadcast-Multicast Service Center (BM-SC) 612 in communication with a content provider server 614. The BM-SC 612 may handle intake of multicast content from one or more sources such as the content provider 614, and provide other higher-level management functions as described below. These functions may include, for example, a membership function, including authorization and initiation of MBMS services for an identified UE. The BM-SC 612 may further perform MBMS session and transmission functions, scheduling of live broadcasts, and delivery, including MBMS and associated delivery functions. The BM-SC 612 may further provide service advertisement and description, such as advertising content available for multicast. A separate Packet Data Protocol (PDP) context may be used to carry control messages between the UE and the BM-SC. The BM-SC may further provide security functions such as key management, manage charging of content providers according to parameters such as data volume and QoS, provide content synchronization for MBMS in UTRAN and in E-UTRAN for broadcast mode, and provide header compression for MBSFN data in UTRAN. The BM-SC 612 may indicate session start, session update and session stop to the MBMS-GW 616 including session attributes such as QoS and MBMS service area.

The system 600 may further include a Multicast Management Entity (MME) 608 in communication with the MCE 606 and MBMS-GW 616. The MME 608 may provide a control plane function for MBMS over E-UTRAN. In addition, the MME 608 may provide the eNB 604 and the MCE 606 with multicast related information defined by the MBMS-GW 616. An Sm interface between the MME 608 and the MBMS-GW 616 may be used to carry MBMS control signaling, for example, session start and session stop signals.

The system 600 may further include a Packet Data Network (PDN) Gate Way (GW) 610, sometimes abbreviated as a P-GW. The P-GW 610 may provide an Evolved Packet System (EPS) bearer between the UE 602 and BM-SC 612 for signaling and/or user data. As such, the P-GW may receive Uniform Resource Locator (URL) based requests originating from UEs in association with IP addresses assigned to the UEs. The BM-SC 612 may also be linked to one or more content providers via the P-GW 610, which may communicate with the BM-SC 612 via an IP interface.

Data may be delivered via eMBMS using a file download delivery method or a streaming delivery method. Continuous multimedia data, such as video data, may be delivered using streaming data delivered over an MBMS bearer. The streaming video data in a broadcast-multicast service may be broken into smaller video objects, each with a given duration. Each video object may be further broken down into one or more source blocks, in which each source block may be made up of a certain number of forward error correction (FEC) data symbols.

In eMBMS systems, an eMBMS service is scheduled for downlink transmission over the transmission period on a corresponding MBMS traffic channel (MTCH). Over a given streaming video duration, multiple MCH scheduling periods (MSP) may be scheduled during which the service will broadcast the streaming video data using the MTCH to transmit the streaming video data. As illustrated in FIG. 7, seven MSPs are scheduled, during which the streaming video data is transmitted on the MTCH associated with the selected eMBMS service. The MTCH is multiplexed on the physical channel for transmission, which results in the MTCH being transmitted in allocated MBSFN subframes during the MSP. Thus, the MTCH is not transmitted continuously on the transmission resource. Each burst of MTCH within the MSP may include transmission of multiple data symbols.

A video object (or video segment) may last one or a few seconds. A video object may be set to include various numbers of symbols, each of fixed symbol length, such as 60, 80, 100, 150, and the like bytes per symbol. The total number of symbols per video object may be determined through additional information contained in a file delivery table (FDT) associated with the broadcast-multicast service. For example, the FDT includes the encoding symbol length, and transfer length and FEC redundancy level. Using this information, the application processor of a receiver modem may determine the total number of symbols per video object by dividing the transfer length multiplied by (1+FEC %) by the encoding symbol length. The result of the calculation corresponds to the number of data symbols per video object, including source and redundancy symbols.

FIG. 7 is a block diagram illustrating a communication stream 70 including a network entity 71 and a UE 72. Many modern UE devices, such as UE 72, include support for multiple radio access technologies (RATs) and may include multiple subscriber identification modules (SIMs) that provide authorized access to the multiple RATs, such as LTE, CDMA2000 (1×), and GSM. Because a multi-RAT/multi-SIM UE will monitor multiple RATs for paging, there may be occasions in which the scheduled tune away period, during which, for example, the UE tunes away from the LTE network to monitor for pages on the 1× and GSM networks, causes streaming video data in an MTCH transmitted within an MSP during the UE's tune away period to be lost. For example, UE 72 is tuned to an eMBMS video service to receive streaming video content. The video data objects are transmitted by network entity 71 over MTCH within scheduled MSPs, such as MSP i–MSP i+6. However, UE 72 also includes a user subscription to another RAT (e.g., 1×, GSM, and the like) for additional communications. Occasionally, UE 72 is scheduled to tune away from LTE with the eMBMS service to listen for pages on the other RAT. At page monitoring occasions 701 and 702, UE 72 tunes away from the eMBMS network to listen for any pages over the other RAT. During this tune away time, however, UE 72 may lose any video data transmitted during the colliding MTCH.

Typically, eMBMS video streaming uses a fixed forward error correction (FEC) percentage per video segment, such as DASH segment 700, during the video session, that may allow a UE to recover from an error or lost data due to the tune away period in which the UE has a limited RF chain shared by LTE, 1× and GSM. For example, each DASH segment may contain video data of one (1) second. Thus, over DASH segment 700, FEC symbols may assist UE 72 to recover lost video data.

In a typical video streaming session, a video object is formatted according a DASH protocol. The encoded data types per DASH segment 700 may vary, while the FEC percentage remains constant. Therefore, in order to cover peak bandwidth, network entity 71, may over-provision MBSFN subframes to cover peak video bandwidth per MSP. However, in one or more MSPs, video may use only a part of the bandwidth. For example, with reference to FIG. 7, of the six MSPs within DASH segment 700, the first four MSPs have enough video data that may use for example 30 MBSFN subframes per MSP. However, the last two MSP use little or no MBSFN subframes (e.g., 10 to 0 MBSFN subframes). Because the FEC percentage remains constant across the DASH segment, the unused portion of the bandwidth allocated to handle peak levels will be wasted, as there will not be enough data sent in the last two MBSFN subframes to fill the allocated bandwidth.

Various aspects of the present disclosure are directed to a dynamic FEC that allows the network to modify the FEC percentage setting based on the amount of unused bandwidth available in the DASH segment. This dynamically variable FEC setting may result in better error performance by allowing the unused bandwidth to be utilized. That is, if the network has allocated a bandwidth of C, then the network may allocate FEC percentage in order to use as much as of the bandwidth, C.

Figure 8B:
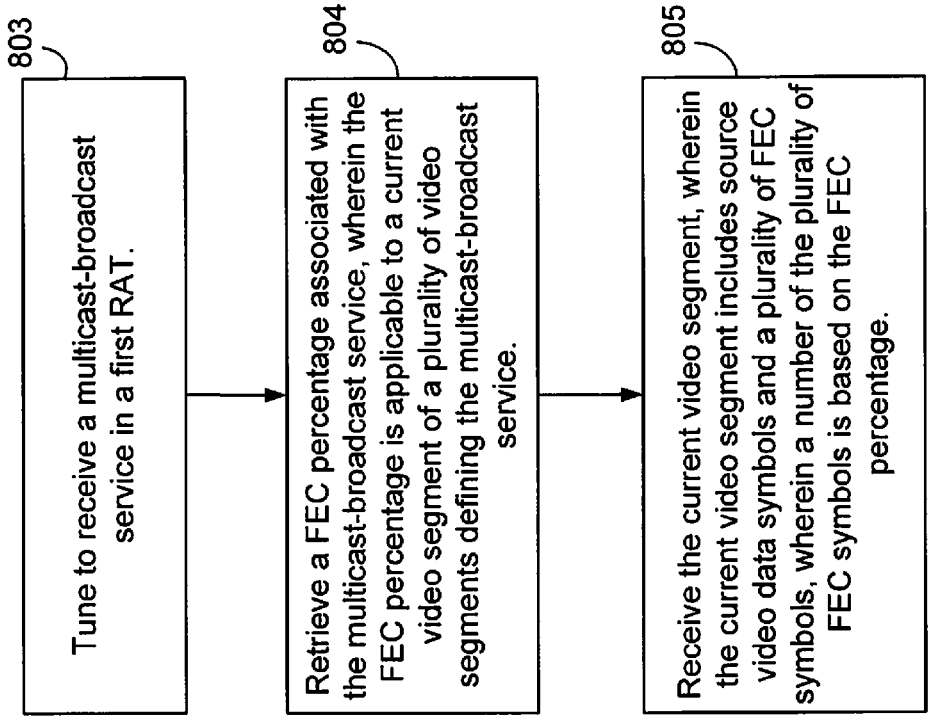
FIGS. 8A and 8B are block diagrams illustrating example blocks executed to implement aspects of the present disclosure.
Figure 8A:
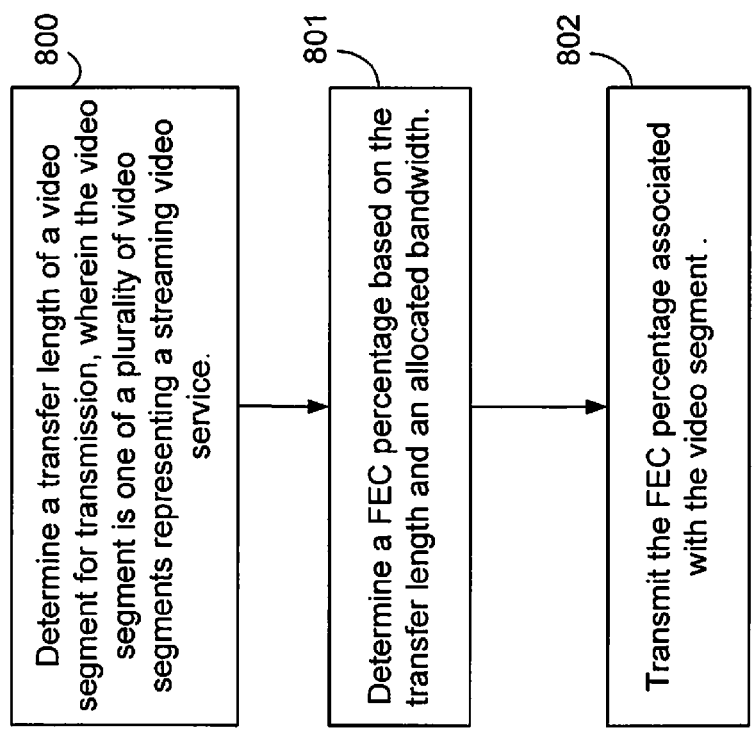

FIG. 8A is a block diagram illustrating example blocks executed to implement one aspect of the present disclosure. At block 800, a network entity, such as BM-SC 612 (FIG. 6), that transmits data for a multicast-broadcast service determines a transfer length of a video segment for transmission, wherein the video segment is one of a plurality of video segments representing a streaming video service. The transfer length includes the number of source data bytes scheduled for transmission, but does not include the redundancy data bytes. The network entity will have the video data that represents the streaming video service and, under control of the network entity processor, may determine the transfer length of each video segment based on transmission characteristics and channel conditions. With the current FEC percentage, the base station may then schedule the transmission of the streaming video segments, including source and redundancy symbols, and allocates the bandwidth for transmission. Accordingly, the base station will be able to determine the encoding of each video segment making up the streaming video service.

At block 801, the network entity, such as BM-SC 612 (FIG. 6), determines a FEC percentage based on the transfer length and an allocated bandwidth. The network entity determines the FEC percentage for the current video segment (e.g., the current DASH segment), based on the determined transfer length and allocated bandwidth. In one example aspect, assuming an n-second DASH segment of transfer length, L, with an available bandwidth of the eMBMS service, C, as allocated by the network for broadcast, the FEC percentage setting for this DASH segment may be up to the following:

$$\text{FEC \%} \cong [(C*n)/L]-1 \quad (1)$$

For example, if C=1.3 Mbps, L=800 kbits, n=1 sec, the FEC percentage will be (1300000*1)/800000−1=60%, according to equation (1). Without this scheme, if the network provisions a constant FEC percentage, it would set the constant FEC in order to handle the peak DASH segment size, which may be 1.3 from the average. In such a case, when setting a constant FEC percentage to handle the peak DASH segment size, a FEC percentage of 25% would be set for all DASH segments. That is (1300000*1)/(800000*1.3)−1=25%. With dynamic FEC, the bandwidth usage of the subframes can be more consistent across the DASH segment. With the increased FEC percentage, the increase in bandwidth may result from an increase in FEC transmissions.

A network entity, such as BM-SC 612 (FIG. 6), will already know the allocated bandwidth, C, has already determined the transfer length, L, and also knows the DASH segment timing, n. As such, under control of the network entity processor, the dynamic FEC percentage will be calculated according to equation (1).

At block 802, the network entity transmits the FEC percentage associated with the video segment. Once the dynamic FEC percentage is determined at block 801, the network entity will signal the new, dynamic FEC percentage for the current video segment. In operation, the standards allow for FEC percentage to be signaled for each DASH segment in the file description table (FDT). The attribute "FEC-Redundancy-Level" is included in the FDT to indicate the FEC redundancy level for the file. Thus, when the network determines the amount of unused bandwidth that will occur in a given DASH segment, it can dynamically determine a new FEC percentage and signal such new FEC percentage in the FDT. A network entity would transmit the streaming video segments through an eNB, for example, eNB 110 including transmit processor 320 from one or more of data source 312 or memory 342, transmit MIMO processor 330, modulator/demodulators 332a-332t, and antennas 334.

FIG. 8B is a block diagram illustrating example blocks executed to implement one aspect of the present disclosure. At block 803, a UE tunes to a frequency on a first RAT to receive a multicast-broadcast service carried over the first RAT. A UE, such as UEs 120 and 92, may be multi-RAT and multi-SIM devices capable of conducting communications over multiple networks by sharing RF processing chains (e.g., RF transmission chain, RF receive chain). The UE that is to receive a streaming video service, such as UEs 120 or 92, will tune to the appropriate network to begin receiving the video data segments carried by MTCH transmissions from a transmitting base station. For example, under control of controller/processor 380 of UE 120, antennas 352a-352r, demodulator/modulators 354a-354r, MIMO detector 356, and receiver processor 358 are caused to receive signals at a designated frequency associated with the frequency of the first RAT carrying the streaming video service.

At block 804, the UE retrieves a FEC percentage associated with the multicast-broadcast service, wherein the FEC percentage is applicable to a current video segment of a plurality of video segments defining the multicast-broadcast service. In operation, an eMBMS video streaming service provides video content that is broken up into multiple video segments, such as DASH segments. The DASH segments are further broken into FLUTE/UDP/IP packets that are transmitted in MTCH at scheduled MSP over the time of the DASH segment. Each video segment may be associated with a FEC percentage according to aspects of the present disclosure. Accordingly, as described with respect to the example aspect, each video segment may include a specific FEC percentage determined for that video segment. The UE, such as UEs 120 or 92, receiving the streaming video service may obtain this FEC percentage from the file description table (FDT) associated with the video service. Thus, UE 120, through antennas 352a-352r, demodulator/modulators 354a-354r, MIMO detector 356, and receiver processor 358, under control of controller/processor 380, may retrieve the FEC percentage associated with the current video segment from the FDT of the video streaming service received over the first RAT.

At block 805, the UE receives the current video segment, wherein the current video segment includes source video data symbols and a plurality of FEC symbols, wherein a number of the plurality of FEC symbols is based on the FEC percentage. The UE, such as UEs 120 or 92 can receive the video segment through antennas 352a-352r, demodulator/modulators 354a-354r, MIMO detector 356, and receiver processor 358, under control of controller/processor 380. The FEC percentage associated with the current video segment allows for the allocated bandwidth to be maximized, even when the available source video data for the current segment does not fill the allocated peak bandwidth. The additional data transmitted to fill the unused bandwidth includes a higher number of FEC symbols.

The higher FEC percentage may increase the error recovery rate. The video streaming service may have a peak to average bandwidth of (1+r) in the encoder, where r represents the percentage bandwidth that the peak bandwidth requires over the average bandwidth. With the current scheme of assigning a constant FEC percentage, FEC is dimensioned to x to cover the peak bandwidth for all transmissions of the streaming video. Thus, when the actual bandwidth used in a given DASH segment is less than the peak amount, the unused bandwidth beyond x is wasted. However, with the dynamic FEC increased according to the various aspects of the present disclosure, FEC percentage may increase according to the equation:

$$\text{FEC \%} = [(1+r)*(1+x)/(1+s)] - 1 \qquad (2)$$

for a particular video segment with a needed bandwidth, (1+s) of the average bandwidth, where s represents the percentage bandwidth needed for transmission over the average bandwidth. Thus, the resulting dynamic FEC percentage according to the aspects of the present disclosure is a function of the allocated bandwidth, (1+r)*(1+x), divided by the needed bandwidth, (1+s). Table 1 below illustrates a comparison between FEC percentages determined according to the current scheme of constant FEC and the dynamic FEC scheme of the various aspects of the present disclosure. The FEC percentages of Table 1 assume the peak to average bandwidth, (1+r), is 1.3 and that the DASH segment has only average bandwidth, s=0.

TABLE 1

| Current FEC % (x) | Dynamic FEC % 1.3 * (1 + x) − 1 |
|---|---|
| 10% | 43% |
| 20% | 56% |
| 30% | 69% |
| 40% | 82% |
| 50% | 95% |

Figure 9:
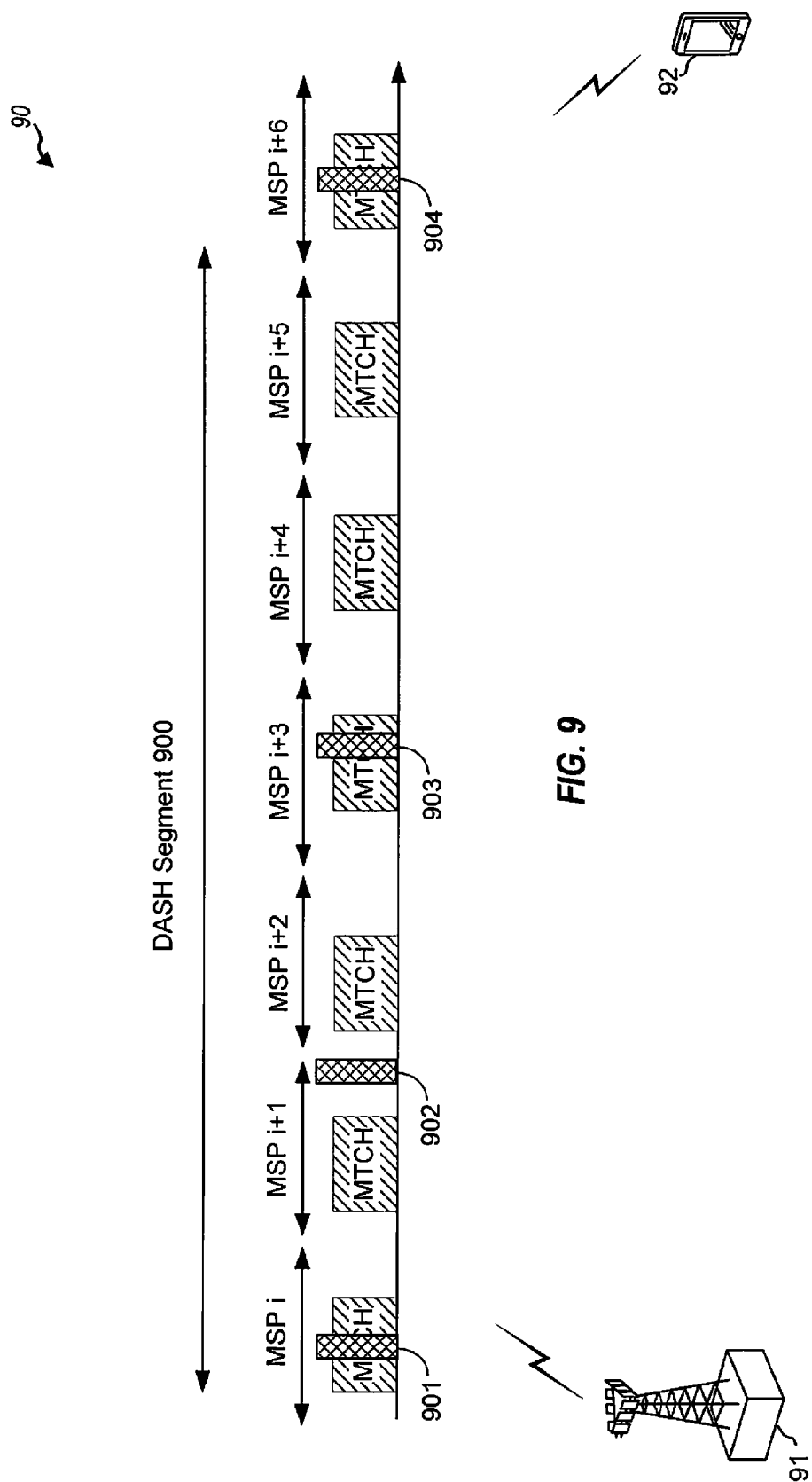
FIG. 9 is a block diagram illustrating a communication stream including a network entity and a UE configured according to one aspect of the present disclosure.

FIG. 9 is a block diagram illustrating a communication stream 90 including a network entity 91 and a UE 92 configured according to one aspect of the present disclosure. UE 92 may include the components and features illustrated with regard to UE 120 (FIG. 3). The higher FEC percentage resulting from the dynamic FEC aspects of the present disclosure may also reduce 1× or GSM page blocking where an arbitration algorithm is implemented to balance video segment loss rate and 1× or GSM mobile terminated (MT) call failure in RF sharing multi-SIM products. UE 92 includes such an arbitration algorithm, which may be stored in memory, such as memory 382, that allows additional page monitoring occasion which collides with MTCH, such as additional page monitoring occasion 903, while page monitoring occasion 902 may be unconditionally allowed as it does not collide with MTCH. The algorithm, under control of controller/processor 380 would provide for the additional page monitoring occasion 903 by tuning antennas 352a-352r, demodulator/modulators 354a-354r, MIMO detector 356, and receiver processor 358 to the 1× or GSM frequencies to monitor for pages. Network entity 91 will determine and transmit the dynamic FEC percentage according to the blocks described in FIG. 8A for DASH segment 900.

As UE 92 tunes antennas 352a-352r, demodulator/modulators 354a-354r, MIMO detector 356, and receiver processor 358 to the frequency for the video streaming service of the first RAT, such as LTE, UE 92 obtains the dynamic FEC percentage from the FDT associated with DASH segment 900. UE 92 may retrieve the dynamic FEC percentage for DASH segment 900 from the FDT and determine that the number of FEC symbols to be transmitted with the video objects of DASH segment 900 exceeds a predetermined threshold. For example, under control of controller/processor 380, the dynamic FEC retrieved from the FDT may be compared against a predetermined threshold stored in memory 382. Thus, when UE 92 detects a collision between the receiving of the video data in the MTCH of MSP i, and the page monitoring occasion 901, the arbitration algorithm within the memory of UE 92, such as memory 382 (FIG. 3), is executed by processors of UE 92, such as controller/processor 380 (FIG. 3), which schedules additional page monitoring occasion 903, within DASH segment 900. That is, if a greater FEC percentage is used for a particular DASH segment, thus, causing a larger number of FEC symbols to be generated for the DASH segment transmission, such arbitration algorithm may allow more 1×/G page monitoring occasions when there is collision with eMBMS service because eMBMS operates under a higher FEC percentage with the DASH segment in order to tolerate more data loss due to the 1×/GSM tune away period.

It should be noted that, in order to provide a large enough number of FEC symbols to meet the predetermined threshold, the FEC percentage may be greater than 50% (e.g., 55%, 60%, 70%, etc.)

With the next DASH segment, after DASH segment 900, UE 92 may again determine whether the dynamic FEC percentage associated with the next video segment offer additional FEC symbols. If not, such as when the next DASH segment transmits source video data at peak bandwidth, the collision between receiving streaming data in MTCH within MSP i+6 and page monitoring occasion 901, will not trigger additional page monitoring occasions 903 within the next DASH segment, as UE 92 will know that fewer FEC symbols will be available for error correction.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and process steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or process described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. A computer-readable storage medium may be any available media that can be accessed by a general purpose or special purpose computer. By way of example, and not limitation, such computer-readable storage media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, non-transitory connections may properly be included within the definition of computer-readable medium. For example, if the instructions are transmitted from a website, server, or other remote source using a coaxial cable, fiber optic cable, twisted pair, or digital subscriber line (DSL), then the coaxial cable, fiber optic cable, twisted pair, or DSL are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A method of wireless communication, comprising:
   determining, by a network entity, a transfer length of a video segment for transmission, wherein the video segment is one of a plurality of video segments representing a streaming video service;
   determining, by the network entity, a forward error correction (FEC) percentage based on the transfer length and an allocated bandwidth, wherein the determining the FEC percentage includes determining the FEC percentage based on:

$$FEC\ \% \approx [(C*n)/L] - 1.$$

where C represents the allocated bandwidth, L represents the transfer length, and n represents a duration of the video segment; and transmitting the FEC percentage associated with the video segment.

2. The method of claim 1, further including:

generating a plurality of FEC symbols according to the FEC percentage; and transmitting the video segment, wherein the video segment includes source video data symbols and the plurality of FEC symbols.

3. The method of claim 1, wherein the FEC percentage is included in a file description table.

4. The method of claim 1, wherein the network entity is a Broadcast-Multicast Service Center (BM-SC).

5. An apparatus configured for wireless communication, comprising at least one processor; and a memory coupled to the at least one processor, wherein the at least one processor is configured to:

determine, by a network entity, a transfer length of a video segment for transmission, wherein the video segment is one of a plurality of video segments representing a streaming video service;

determine, by the network entity, a forward error correction (FEC) percentage based on the transfer length and an allocated bandwidth, wherein the at least one processor being configured to determine the FEC percentage includes configuration to determine the FEC percentage based on:

FEC $\% \approx \lfloor (C*n)/L \rfloor - 1$, where C represents the allocated bandwidth, L represents the transfer length, and n represents a duration of the video segment; and transmit the FEC percentage associated with the video segment.

6. The apparatus of claim 5, wherein the at least one processor is further configured to:

generate a plurality of FEC symbols according to the FEC percentage; and transmit the video segment, wherein the video segment includes source video data symbols and the plurality of FEC symbols.

7. The apparatus of claim 5, wherein the FEC percentage is included in a file description table.

8. The apparatus of claim 5, wherein the network entity is a Broadcast-Multicast Service Center (BM-SC).

* * * * *